(12) United States Patent
Chuang et al.

(10) Patent No.: US 8,349,678 B2
(45) Date of Patent: Jan. 8, 2013

(54) LATERALLY DIFFUSED METAL OXIDE SEMICONDUCTOR TRANSISTOR WITH PARTIALLY UNSILICIDED SOURCE/DRAIN

(75) Inventors: Harry-Hak-Lay Chuang, Hsinchu (TW); Lee-Wee Teo, Singapore (SG); Ming Zhu, Singapore (SG)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 293 days.

(21) Appl. No.: 12/701,824

(22) Filed: Feb. 8, 2010

(65) Prior Publication Data

US 2011/0193162 A1    Aug. 11, 2011

(51) Int. Cl.
*H01L 21/336* (2006.01)
(52) U.S. Cl. .......... 438/197; 438/142; 438/286
(58) Field of Classification Search ......... 438/142, 438/197, 286; 257/213, 369
See application file for complete search history.

(56) References Cited

U.S. PATENT DOCUMENTS

| 2005/0139916 A1* | 6/2005 | Kim et al. ........ 257/346 |
| 2009/0124057 A1* | 5/2009 | Guha et al. ....... 438/301 |
| 2010/0052079 A1* | 3/2010 | Hirano et al. ..... 257/412 |
| 2011/0127607 A1* | 6/2011 | Cai .............. 257/339 |

FOREIGN PATENT DOCUMENTS

CN        101266930        9/2008

OTHER PUBLICATIONS

OA dated Mar. 5, 2012 from corresponding application No. CN201110037576.1.

* cited by examiner

*Primary Examiner* — Jae Lee
(74) *Attorney, Agent, or Firm* — Lowe Hauptman Ham & Berner, LLP

(57) ABSTRACT

A method of fabricating a laterally diffused metal oxide semiconductor (LDMOS) transistor includes forming a dummy gate over a substrate. A source and a drain are formed over the substrate on opposite sides of the dummy gate. A first silicide is formed on the source. A second silicide is formed on the drain so that an unsilicided region of at least one of the drain or the source is adjacent to the dummy gate. The unsilicided region of the drain provides a resistive region capable of sustaining a voltage load suitable for a high voltage LDMOS application. A replacement gate process is performed on the dummy gate to form a gate.

20 Claims, 7 Drawing Sheets

LATERALLY DIFFUSED METAL OXIDE SEMICONDUCTOR TRANSISTOR WITH PARTIALLY UNSILICIDED SOURCE/DRAIN

TECHNICAL FIELD

The present disclosure relates generally to an integrated circuit device, more particularly, to a laterally diffused metal oxide semiconductor (LDMOS) transistor.

BACKGROUND

LDMOS transistors are used in radio frequency (RF)/microwave applications. For example, in power amplifier applications, high output power is required. Therefore, an LDMOS transistor that can handle a high voltage and an increased current is desirable. Also, an LDMOS transistor that uses a polysilicon/SiON gate stack has a control issue in the silicide formation on its gate, resulting in a partially silicided gate during the silicide process. Accordingly, new methods and structures for LDMOS transistors are desired.

BRIEF DESCRIPTION OF THE DRAWINGS

For a more complete understanding of embodiments of the present invention, and the advantages thereof, reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1:
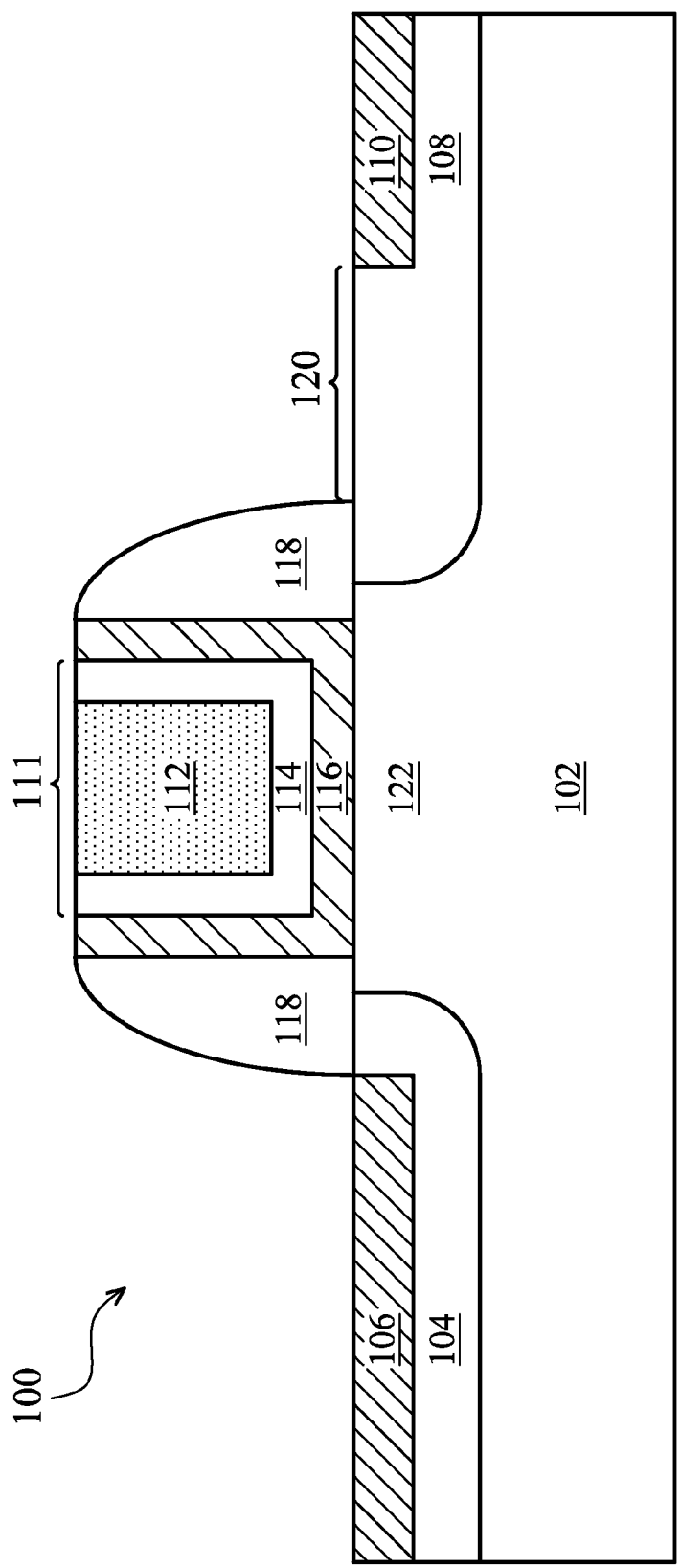
FIG. 1 illustrates a laterally diffused metal oxide semiconductor (LDMOS) transistor in accordance with one or more embodiments.

A structure for a laterally diffused metal oxide semiconductor (LDMOS) transistor is provided. FIG. 1 illustrates a laterally diffused metal oxide semiconductor (LDMOS) transistor in accordance with one or more embodiments. The LDMOS transistor 100 includes a substrate 102, a metal gate 111 over the substrate 102, and a source 104 and a drain 108 over the substrate 102 on opposite sides of the metal gate 111. The substrate 102 may comprise a bulk silicon or silicon-on-insulator substructure. Alternatively, the substrate 102 may comprise other materials, which may or may not be combined with silicon, such as germanium, indium antimonide, lead telluride, indium arsenide, indium phosphide, gallium arsenide, gallium antimonide, or any other suitable material. A gate dielectric layer 116 is disposed over the substrate 102 and between the metal gate 111 and a channel 122 of the transistor 100. Spacers 118 are also shown on opposite sides of the metal gate 111.

A first silicide 106 is disposed on the source 104. A second silicide 110 is disposed on the drain 108. A silicide is an alloy of silicon and metals, used as contact materials in silicon device manufacturing, e.g., $TiSi_2$, $CoSi_2$, $NiSi$, other silicide, or any combinations thereof. The silicide combines advantageous features of metal contacts (e.g., significantly lower resistivity than polysilicon) and polysilicon contacts (e.g., no electromigration). The drain 108 has an unsilicided region 120 adjacent to the metal gate 111 to provide a resistive region capable of sustaining a voltage load suitable for a high voltage LDMOS application.

For example, LDMOS transistors are widely used in power amplifiers for base-stations that use a high output power with a corresponding drain to source breakdown voltage usually above 60 volts. Many high power RF applications use direct current (DC) supply voltages ranging from about 20 to about 50 volts.

In one example, the unsilicided region 120 can be defined between the spacer 118 and the silicide 110. In some embodiments, the unsilicided region 120 has a length ranging from about 0.05 μm to about 1 μm. The gate dielectric layer 116 comprises a high-k gate dielectric material. The materials that may be used to make the high-k gate dielectric include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or any other suitable material. The metal gate 111 can comprise more than one metal layers, e.g. a work function metal layer 114 and a trench fill metal layer 112. The trench fill metal layer 112 can comprise tungsten, aluminum, titanium, titanium nitride, or any other suitable material.

Table 1 below shows a performance comparison between a LDMOS transistor using a polysilicon ("poly")/SiON gate stack and a LDMOS transistor using a high-k dielectric/metal gate stack in accordance with one or more embodiments. The LDMOS transistors have the same equivalent oxide thickness (EOT) of 28 angstroms and the gate length Lg of 1 μm. The on-state current $I_{on}$ of the LDMOS transistor using a high-k dielectric/metal gate stack in accordance with one or more embodiments shows about 4% increase compared to the on-state current $I_{on}$ of the LDMOS transistor using the poly/SiON gate stack, due to the elimination of the poly depletion effect.

TABLE 1

| LDMOS | Poly/SiON | HK/MG |
|---|---|---|
| $V_{t\,lin}$ (V) | 0.256 | 0.257 |
| $V_{t\,sat}$ (V) | 0.251 | 0.251 |
| $I_{d\,lin}$ (μA/μm) | 19.6 | 20.1 |
| $I_{on}$ (μA/μm) | 402.5 | 419.9 |
| DIBL (mV) | 5.4 | 5.3 |

The current $I_{d\,lin}$ in the linear region of the LDMOS transistor using the high-k dielectric/metal gate stack in accordance with one or more embodiments also has an increased value. The threshold voltages $V_{t\,lin}$ in the linear region and $V_{t\,sat}$ in the saturation region for both the LDMOS transistors are similar to each other. The drain induced barrier lowering (DIBL) values are also similar to each other.

Regarding on-state resistance distribution, an exemplary embodiment of the LDMOS transistor using the high-k dielectric/metal gate stack showed a source resistance of 107 ohm-cm, which is about 4.3% of the total on-state resistance of the transistor. The channel resistance was 1460.2 ohm-cm, which is about 58.7% of the total on-state resistance of the transistor. The drain resistance was 920.4 ohm-cm, which is about 37% of the total on-state resistance of the transistor. These values are similar to the on-state resistance distribution of a LDMOS transistor using the poly/SiON gate stack.

Figure 2:
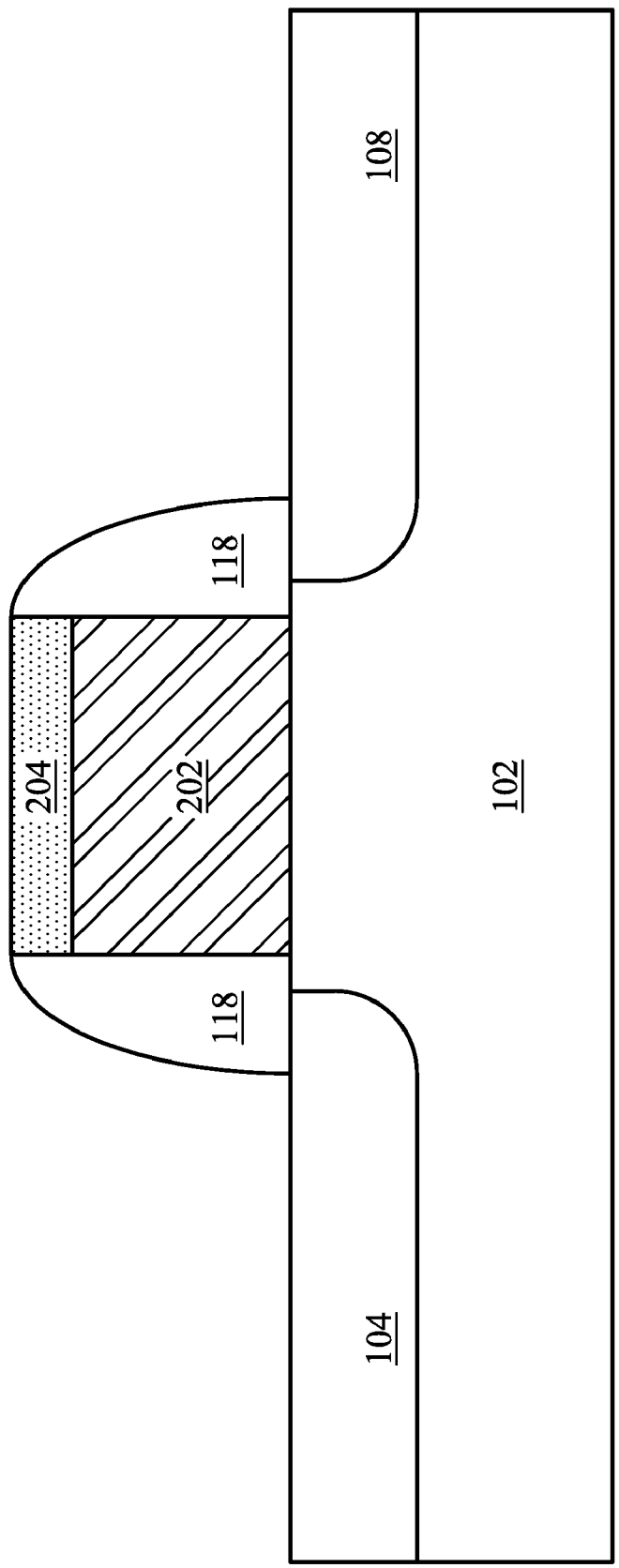
FIG. 2-FIG. 7 illustrate various stages of an exemplary method of fabrication of the LDMOS transistor in accordance with one or more embodiments.

FIG. 2-FIG. 7 illustrate various stages of an exemplary method of fabrication of the LDMOS transistor in accordance with one or more embodiments. FIG. 2 shows a dummy gate 202 formed over the substrate 102. In one example, the dummy gate 202 can comprise, for example, polysilicon. A hardmask 204 is formed over the dummy gate 202. The hard mask 204 and the dummy gate 202 may be patterned by applying a photolithographic process and/or an etch process. In one example, the polysilicon dummy gate 202 has a thickness between about 100 and about 2,000 angstroms. The hardmask 204 may comprise silicon nitride, silicon dioxide and/or silicon oxynitride, and may have a thickness between about 100 and about 500 angstroms.

The spacers 118 are formed on opposite sides of the dummy gate 202. The spacers 118 may comprise, for example, silicon nitride. After forming the spacers 118, the source 104 and the drain 108 are formed over the substrate 102 on opposite sides of the dummy gate 202. The source 104 and the drain 108 may be formed by implanting ions into the substrate 102, followed by applying an appropriate anneal step. After the ion implantation and anneal steps, portions of the source 104 and the drain 108 may be converted to silicides as described below.

Figure 3:
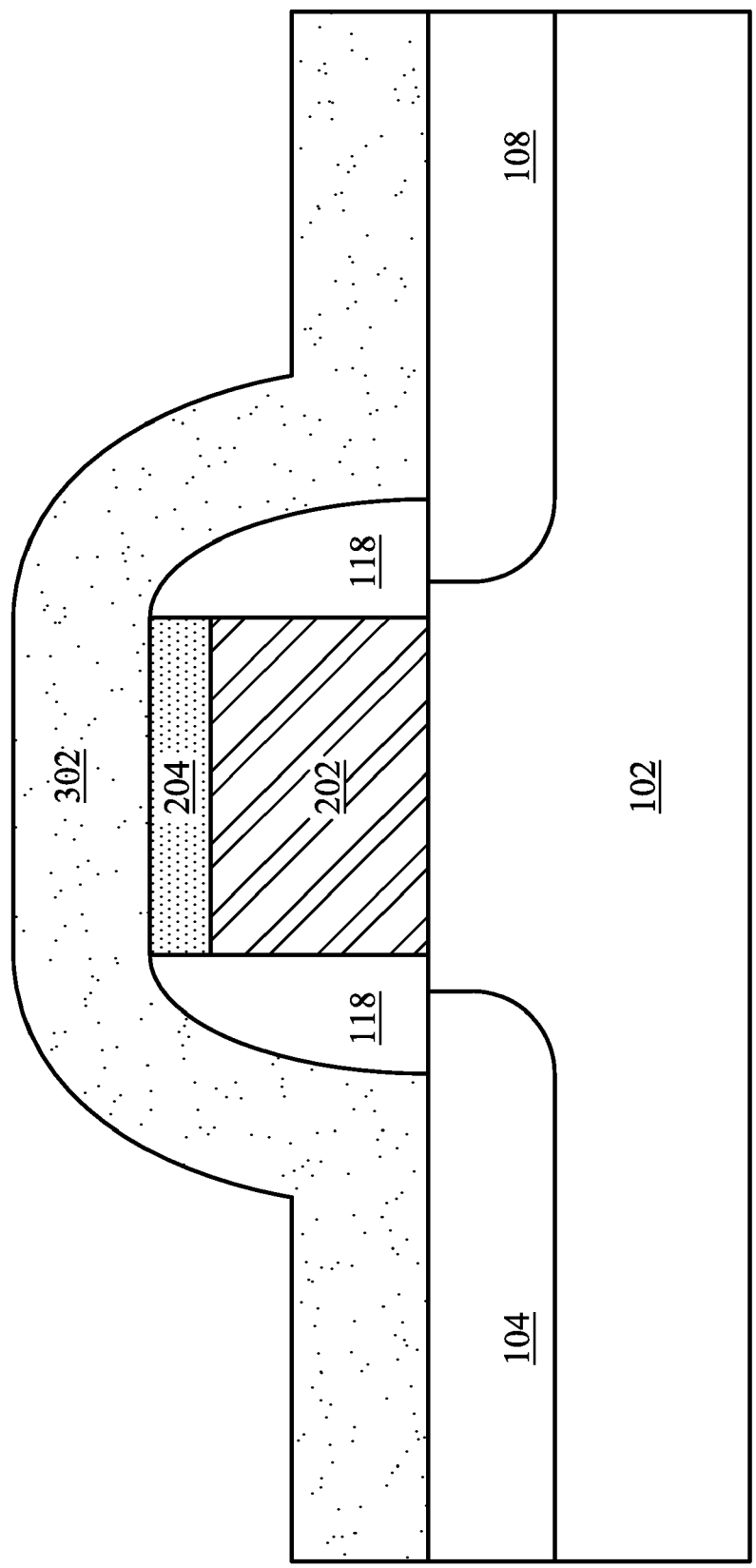

In FIG. 3, a resist protect oxide (RPO) layer 302 is formed over the hardmask 204, the dummy gate 202, the spacers 118, the source 104, and the drain 108. After covering all device area defined over the surface of the substrate 102 with the RPO layer 302, the device area can be divided into an area that is to be silicided for electrical contacts and another area that is not to be silicided. In one example, the RPO layer 302 is formed using silicon dioxide.

Figure 4:
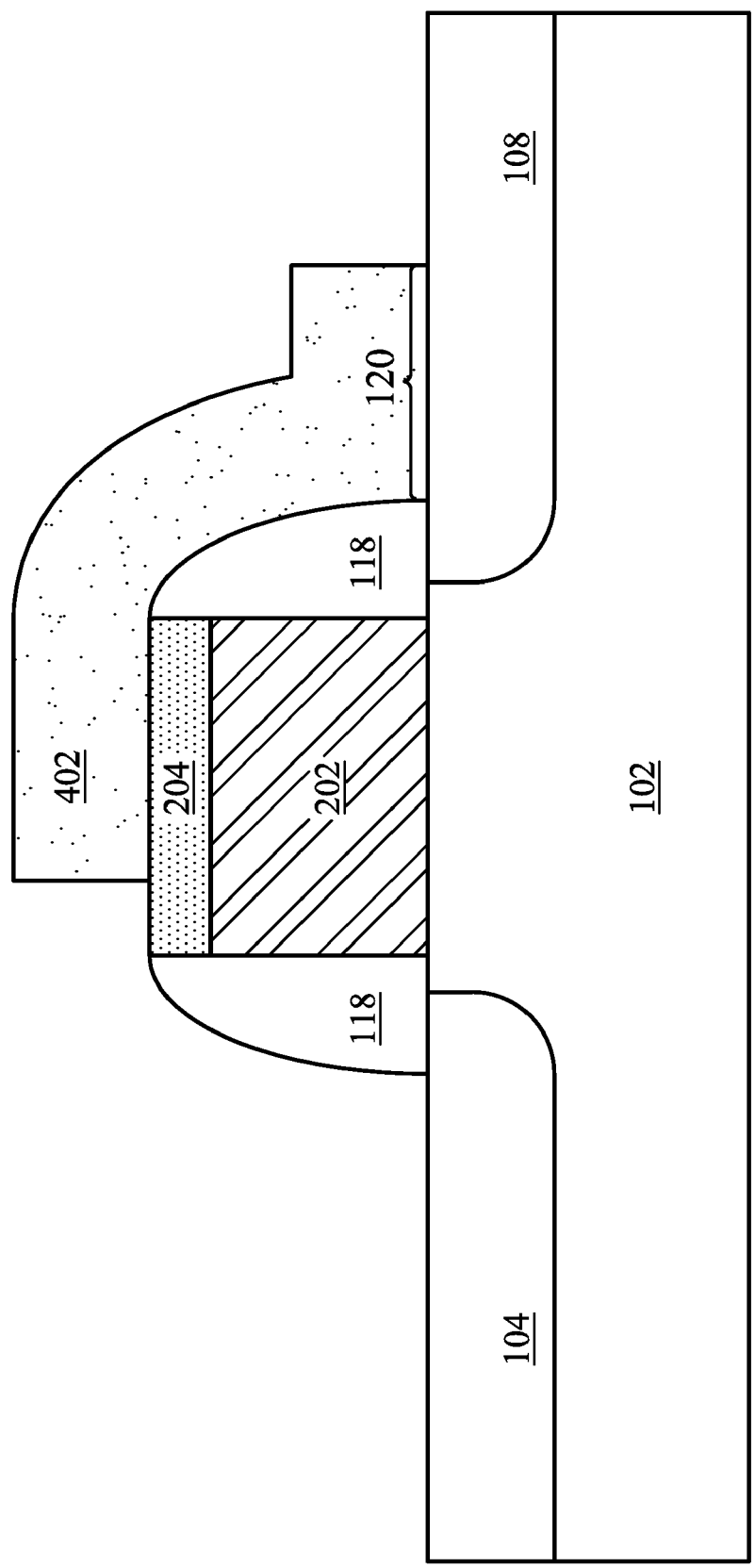

In FIG. 4, the RPO layer 302 (shown in FIG. 3) is partially etched away, leaving the RPO layer 402 over at least a portion of the dummy gate 202, extending over the drain 108. The device area that is not to be silicided is covered with the RPO layer 402. The RPO layer 402 can be defined by applying, for example, an oxide wet etch that partially removes the RPO layer 302. This protects the areas under the RPO layer 402 from the silicide formation. The hardmask 204 also protects the dummy gate 202 from the silicide formation.

Figure 5:
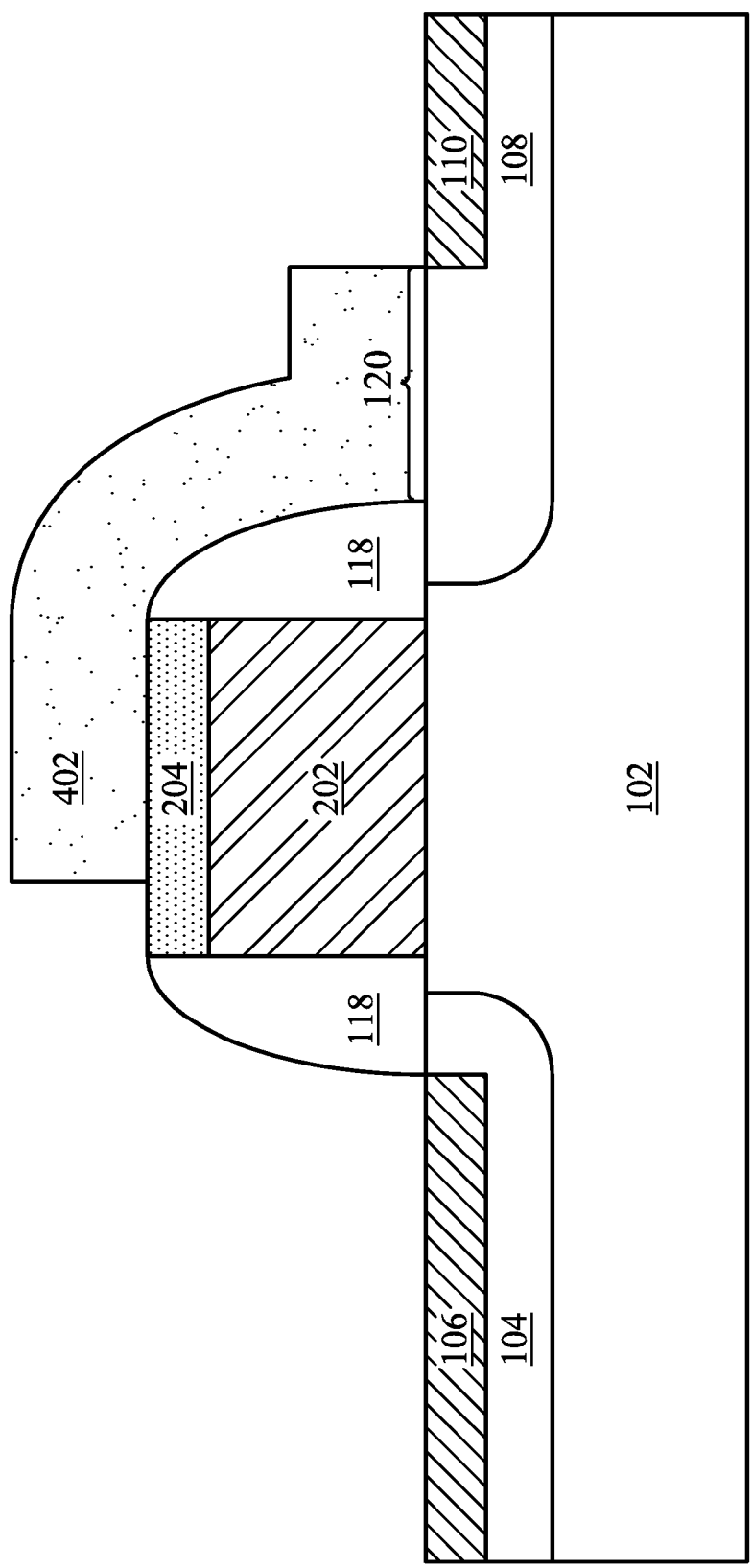

In FIG. 5, a silicide process is performed to form the first silicide 106 and the second silicide 110. The first silicide 106 is formed on the source 104. The second silicide 110 is formed on the drain 108 so that the unsilicided region 120 of the drain 108 is left adjacent to the dummy gate 202. The unsilicided region 120 of the drain 108 provides a highly resistive region capable of sustaining a voltage load suitable for a high voltage LDMOS application as described above. In one example, the unsilicided region 120 has a length ranging from about 0.05 μm to about 1 μm.

Figure 6:
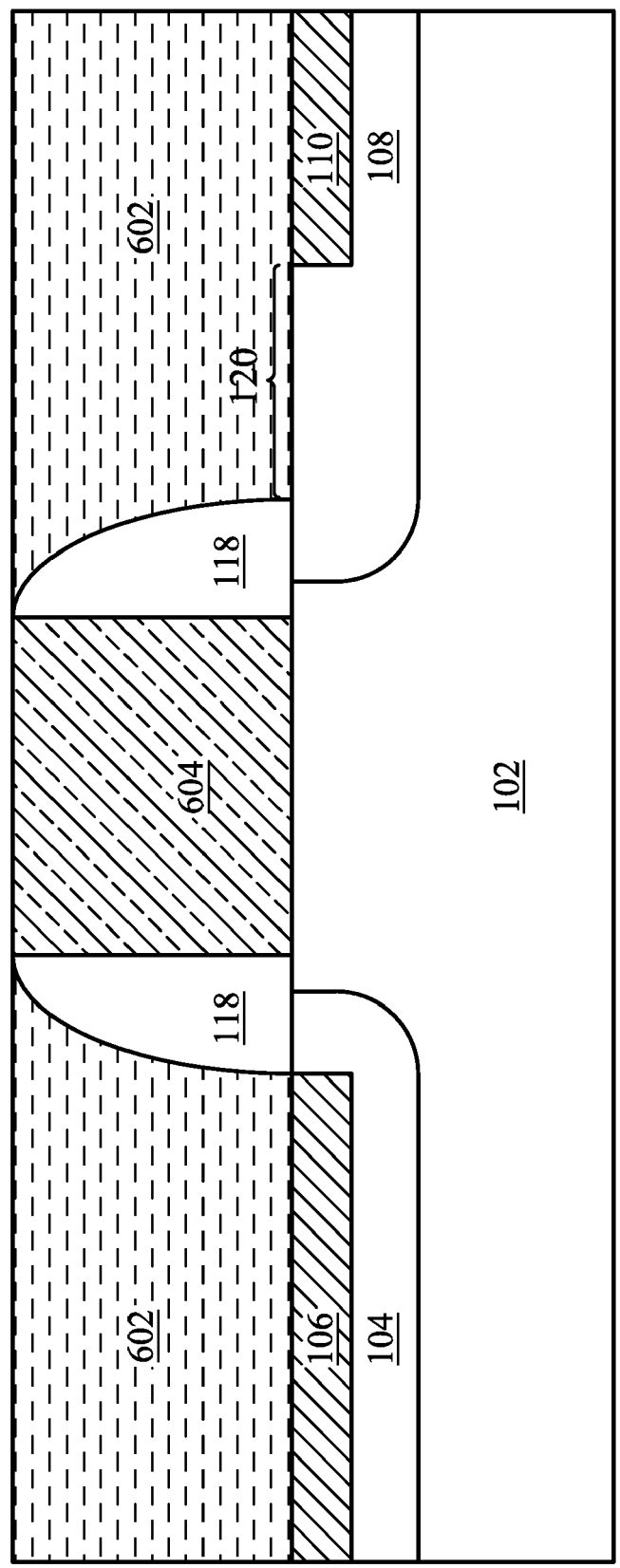
Figure 7:
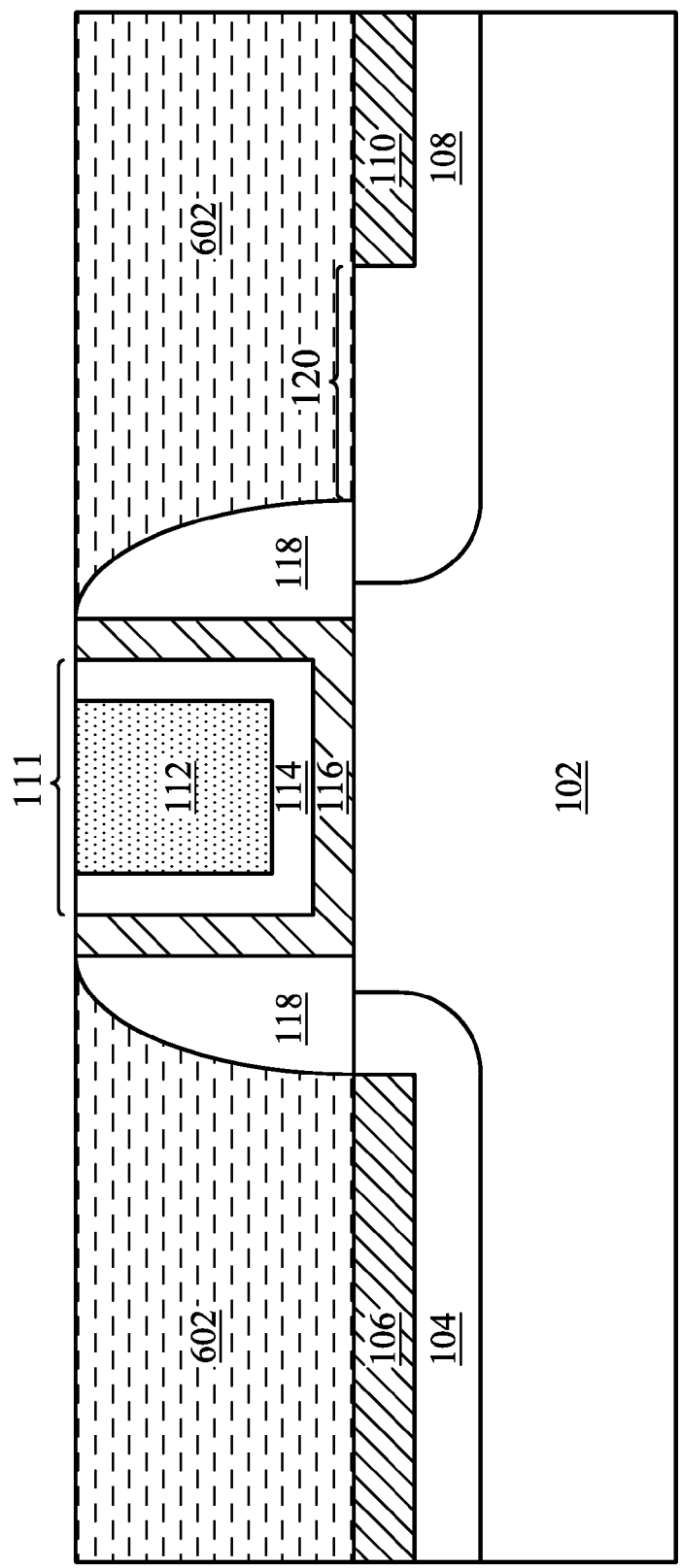

In FIG. 6-FIG. 7, a replacement gate process is performed on the dummy gate 202 (shown in FIG. 5). In FIG. 6, after forming the silicided regions 106 and 110 over the source 104 and the drain 108, the RPO layer 402 (shown in FIG. 5) can be removed and a dielectric layer 602 can be deposited over the device area. The dielectric layer 602 may comprise silicon dioxide, a low-k material, or any other suitable material. The dielectric layer 602 may be doped with phosphorus, boron, or other elements, and may be formed using a high-density plasma deposition process.

FIG. 6 shows the dielectric layer 602 after being polished for the replacement gate process. A chemical mechanical polishing (CMP) operation may be applied to remove a part of the dielectric layer 602. After exposing the hardmask 204 (shown in FIG. 5), the hardmask 204 is removed to expose the dummy gate 202. In some embodiments, the hardmask 204 may be polished from the surface of the dummy gate 202 when dielectric layer 602 is polished. The dummy gate 202 (shown in FIG. 5) that is bracketed by the spacers 118 is removed to create a trench 604 between the spacers 118. A selective wet etch process can be applied to remove the dummy gate 202.

In FIG. 7, the gate dielectric layer 116 is formed over substrate 102 at the bottom of trench 604 after removing the dummy gate 202. The trench 604 is filled with the metal gate 111 over the gate dielectric layer 116. Although the gate dielectric layer 116 may comprise any material that may serve as a gate dielectric for a transistor that includes a metal gate electrode, the gate dielectric layer 116 can comprise a high-k dielectric material.

The gate dielectric layer 116 may be formed over the substrate 102 using a deposition method, e.g., a chemical vapor deposition (CVD), a low pressure CVD, or a physical vapor deposition (PVD) process. In many applications, a high-k gate dielectric layer can be less than about 60 angstroms in thickness. In some embodiments, to remove impurities from the gate dielectric layer 116 and to increase that layer's oxygen content, a wet chemical treatment may be applied to the gate dielectric layer 116.

In some embodiments, the metal gate 111 can comprise more than one metal layers. For example, the work function metal layer 114 can be deposited over the gate dielectric layer 116, and the trench fill metal layer 112 can be deposited over the work function metal layer 114. The work function metal layer 114 for NMOS transistors can comprise hafnium, zirconium, titanium, tantalum, aluminum, their alloys, e.g., metal carbides that include these elements, i.e., hafnium carbide, zirconium carbide, titanium carbide, tantalum carbide, and aluminum carbide, or any other suitable material. The work function metal layer 114 may be formed on the gate dielectric layer 116 using PVD and/or CVD processes, e.g., sputter and/or atomic layer CVD processes.

In some embodiments, the work function metal layer 114 for NMOS transistors can have a work function that is between about 3.9 eV and about 4.2 eV. The work function metal layer 114 can fill up the trench and have a thickness that is between about 100 angstroms and about 2,000 angstroms if no trench fill metal layer 112 is deposited. If the trench metal 112 is deposited over the work function metal 114 to fill the trench 604, the trench fill metal layer 112 can comprise a material that may be easily polished, e.g., tungsten, aluminum, titanium, titanium nitride, and/or any other suitable material. In such an embodiment, the work function metal layer 114 may have a thickness between about 50 and about 1,000 angstroms.

The work function metal layer 114 for PMOS transistors can comprise ruthenium, palladium, platinum, cobalt, nickel, conductive metal oxides, e.g., ruthenium oxide, or any other suitable material. In some embodiments, the work function metal layer 114 for PMOS transistors can have a work function that is between about 4.9 eV and about 5.2 eV.

In the embodiments specifically disclosed with respect to FIGS. 1-7, the drain 108 outside the spacers 118 is partially unsilicided. However, in some other embodiments, the source 104 outside the spacers 118 is partially unsilicided, whereas the drain 108 outside the spacers 118 is fully silicided. In further embodiment, both the source 104 and the drain 108 outside the spacers 118 are partially unsilicided. A substantially same effect is achieved in that the unsilicided region(s) of the drain 108 and/or the source 104 provide(s) one or more highly resistive regions capable of sustaining a voltage load suitable for a high voltage LDMOS application as described above.

Embodiments of the fabrication process described above may provide improved process control of the gate region compared to a known process for a poly/SiON gate stack, because no silicide formation is necessary on the gate region. Also, the high-k dielectric/metal gate stack enables the structure to have less process variations. To reduce process cost and complexity, the LDMOS can be fabricated through a careful logic operation to define silicide area and manipulation of existing fabrication processes. A skilled person in the art will appreciate that there can be many embodiment variations of this invention.

Although embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function and/or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a laterally diffused metal oxide semiconductor (LDMOS) transistor, the method comprising:
    forming a dummy gate over a substrate;
    forming a source and a drain over the substrate on opposite sides of the dummy gate;
    forming a first silicide on the source and a second silicide on the drain, while leaving an unsilicided region on only one of the drain or the source adjacent to the dummy gate to provide a resistive region configured to sustain a voltage load in a high voltage LDMOS application; and
    performing a replacement gate process on the dummy gate to form a gate.

2. The method of claim 1, further comprising forming a hardmask over the dummy gate.

3. The method of claim 1, further comprising forming a resist protect oxide (RPO) layer over at least a portion of the dummy gate and over the unsilicided region to protect areas under the RPO layer from a silicide process for forming the first and second silicides.

4. The method of claim 1, further comprising forming a first spacer and a second spacer on opposite sides of the dummy gate, wherein the unsilicided region is not covered by any of the first and second spacers.

5. The method of claim 1, wherein the unsilicided region has a length ranging from about 0.05 μm to about 1 μm.

6. The method of claim 1, wherein the gate comprises more than one metal layers.

7. The method of claim 1, wherein the replacement gate process comprises forming a gate dielectric layer between the gate and the substrate.

8. The method of claim 7, wherein the gate dielectric layer comprises a high-k dielectric material.

9. The method of claim 7, wherein the replacement gate process further comprises depositing a work function metal over the gate dielectric layer.

10. The method of claim 9, wherein the replacement gate process further comprises depositing a trench fill conductive material over the work function metal, the trench fill conductive material being selected from the group consisting of tungsten, aluminum, titanium, and titanium nitride.

11. A method of fabricating a laterally diffused metal oxide semiconductor (LDMOS) transistor, the method comprising:
    forming a dummy gate over a substrate;
    forming a hardmask over the dummy gate;
    forming a first spacer and a second spacer on opposite sides of the dummy gate;
    forming a source and a drain over the substrate on opposite sides of the dummy gate;
    forming a first silicide on the source adjacent to the first spacer without leaving an unsilicided region of the source between the first spacer and the first silicide;
    forming a second silicide on the drain adjacent to the second spacer while leaving an unsilicided region of the drain between the second spacer and the second silicide; and
    performing a replacement gate process on the dummy gate to form a high-k gate dielectric layer and a gate.

12. The method of claim 11, further comprising forming a resist protect oxide (RPO) layer over at least a portion of the dummy gate and over the unsilicided region to protect areas under the RPO layer from a silicide process for forming the first and second silicides.

13. The method of claim 11, wherein the unsilicided region has a length ranging from about 0.05 μm to about 1 μm.

14. The method of claim 11, wherein the replacement gate process comprises depositing a work function metal as at least a part of the gate.

15. A method of fabricating a laterally diffused metal oxide semiconductor (LDMOS) transistor, the method comprising:
    forming a dummy gate over a substrate;
    forming a source and a drain over the substrate on opposite sides of the dummy gate;
    forming a first silicide on the source and a second silicide on the drain, while leaving an unsilicided region of at least one of the drain or the source adjacent to the dummy gate to provide a resistive region configured to sustain a voltage load in a high voltage LDMOS application; and
    performing a replacement gate process on the dummy gate to form a gate;
    wherein the method further comprises:
    forming a resist protect oxide (RPO) layer over at least a portion of the dummy gate and over the unsilicided region to protect areas under the RPO layer from a silicide process for forming the first and second silicides.

16. The method of claim 15, further comprising forming a hardmask over the dummy gate.

17. The method of claim 15, further comprising forming a first spacer and a second spacer on opposite sides of the dummy gate, wherein the unsilicided region is not covered by any of the first and second spacers.

18. The method of claim 15, wherein the unsilicided region has a length ranging from about 0.05 μm to about 1 μm.

19. The method of claim 15, wherein the gate comprises more than one metal layers.

20. The method of claim 15, wherein the replacement gate process comprises forming a gate dielectric layer between the gate and the substrate.

* * * * *